(12) United States Patent  (10) Patent No.: US 7,484,293 B2
Yamaji et al.  (45) Date of Patent: Feb. 3, 2009

(54) SEMICONDUCTOR PACKAGE AND MANUFACTURING METHOD THEREFOR

(75) Inventors: Yoshiyuki Yamaji, Otsu (JP); Hirokazu Noma, Yasu (JP); Hiroyuki Mori, Yasu (JP)

(73) Assignee: International Business Machines Corporation, Armonk, NY (US)

( * ) Notice: Subject to any disclaimer, the term of this patent is extended or adjusted under 35 U.S.C. 154(b) by 188 days.

(21) Appl. No.: 11/567,804

(22) Filed: Dec. 7, 2006

(65) Prior Publication Data

US 2007/0145551 A1  Jun. 28, 2007

(30) Foreign Application Priority Data

Dec. 28, 2005  (JP)  ............................. 2005-378948

(51) Int. Cl.
*H05K 3/34* (2006.01)
(52) U.S. Cl. ............................ 29/840; 174/260; 29/843
(58) Field of Classification Search ................ 174/260, 174/261, 267; 361/772–776; 29/842–845, 29/840; 257/737, 752
See application file for complete search history.

(56) References Cited

U.S. PATENT DOCUMENTS 5,762,845 A * 6/1998 Crumly ...................... 264/104

2005/0006788 A1  1/2005  Kaneko

FOREIGN PATENT DOCUMENTS

| CN | 1560911 A | 1/2005 |
| JP | 06-033106 A | 2/1994 |
| JP | 11054927 A | 2/1999 |
| JP | 2001177010 | 6/2001 |
| JP | 2001177010 A | 6/2001 |
| JP | 2002043558 | 2/2002 |
| JP | 2002043558 A | 2/2002 |
| JP | 2005-5568 A | 6/2005 |
| JP | 2005243231 A | 8/2005 |
| JP | 2005243231 | 9/2005 |

* cited by examiner

*Primary Examiner*—Jeremy C Norris
(74) *Attorney, Agent, or Firm*—Robert R. Williams; Shimokaji & Associates, P.C.

(57) ABSTRACT

A semiconductor package that has a superior high frequency characteristics and that can obtain a large area for an internal wiring pattern is provided. According to the present invention, a semiconductor package includes: a multilayer printed wiring board 12, and an IC chip, mounted on the obverse face of the multilayer wiring board 12, and multiple bump terminals 16, mounted on the reverse face. Each bump terminal 16 includes an insulating core 42 having a flat face 40 and a conductive coating deposited on all external surfaces except that of the flat face 40. The end faces of the conductive coatings 44 appear like rings around the insulating cores 42, and are soldered to annular connection pads 52 formed on the reverse face of the multilayer printed wiring board 12. Vias 36 are arranged immediately above the bump terminals 16, and clearance holes 34, the diameter of which is smaller than the diameter of the bump terminals 16, are formed in internal wiring patterns 28 and 30 to permit the passage of the vias 36.

4 Claims, 14 Drawing Sheets

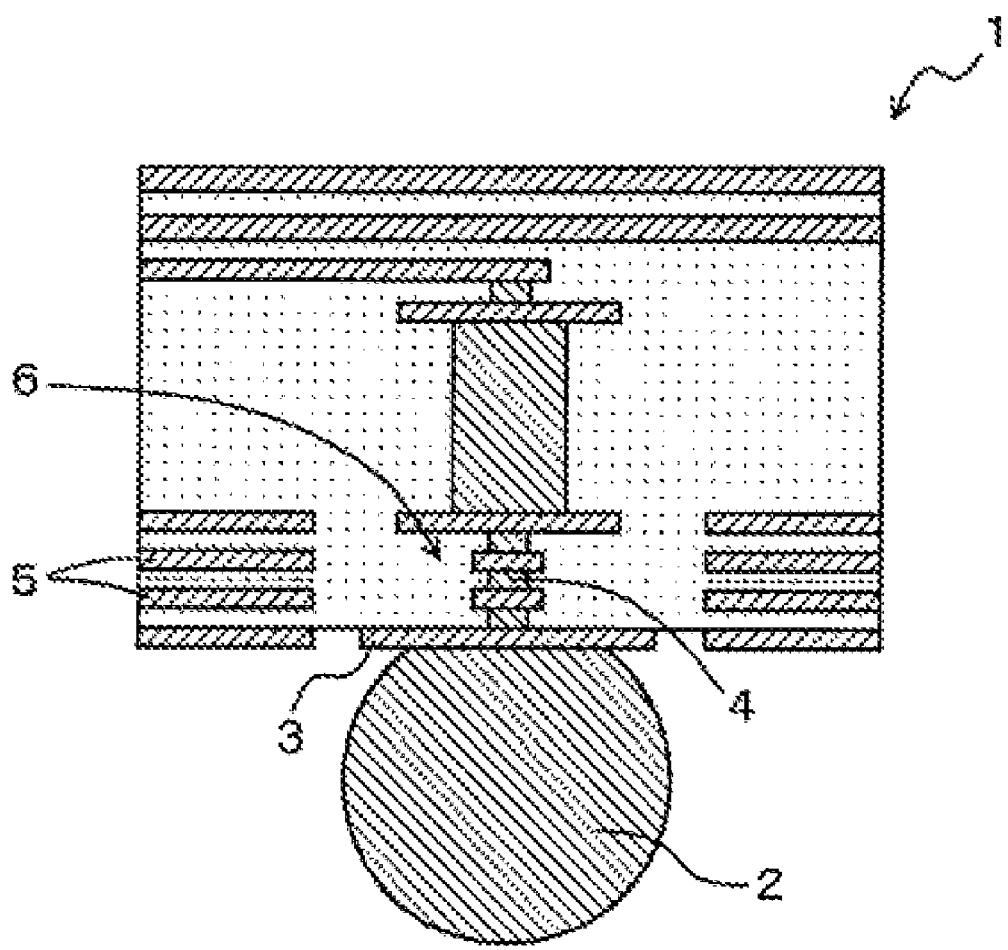
Fig. 34        (Prior Art)

SEMICONDUCTOR PACKAGE AND MANUFACTURING METHOD THEREFOR

BACKGROUND OF THE INVENTION

1. Field of the Invention

The present invention relates to a semiconductor package and a manufacturing method therefor, and more particularly, to a semiconductor package in which an integrated circuit chip is mounted on the surface of a multilayer printed wiring board.

2. Background of the Invention

One result of the development of surface-mount technology is the subsequent development of a semiconductor package in which an integrated circuit chip (hereinafter referred to as an IC chip) is directly mounted on the obverse face of a multilayer printed wiring board. In a semiconductor package that includes a BGA (Ball Grid Array), a grid shaped array of multiple bump terminals is bonded to the multilayer wiring board reverse face (opposite the obverse, IC chip mounted face). At these bump terminals, the semiconductor package is soldered to a motherboard (another printed wiring board). FIG. 34 presents an example, conventional structure of a bump terminal bonded to a multilayer printed wiring board.

In FIG. 34, a bump terminal 2, commonly called a solder ball, is formed on the reverse face of a multilayer printed wiring board 1 and is attached to a disc shaped BGA pad 3. The BGA pad 3 is connected to an IC chip (not shown) by a via 4 located immediately above the solder ball 2. A clearance hole 6, in which the via 4 is accommodated, is formed in an internal wiring pattern 5.

To accommodate the via 4, the diameter of the clearance hole 6 must be only a little larger than that of the via 4. However, when the clearance hole 6 diameter is smaller than the BGA pad 3, and the internal wiring pattern 5 extends upward, above the BGA pad 3, a parasitic capacitance between the BGA pad 3 and the internal wiring pattern 5 is increased and a high frequency characteristics is deteriorated. Thus, the high frequency characteristics are occasionally improved by expanding the diameter of the clearance hole 6 to greater than that of the BGA pad 3.

However, since there are many BGA pads 3, if the clearance hole 6 diameter is increased, a much smaller area will be available for the internal wiring pattern 5. And especially if the area available for a power supply or a grounded wiring pattern is reduced, the supply of power will be adversely affected and the voltage will not be stable.

The invention, as related to appropriate bump structure locations, the shape and the size of bumps and the manufacturing method, is disclosed in Japanese Unexamined Patent Publication (Kokai) No. 2005-5568 (Patent Document 1). This bump structure, formed on an insulating layer, includes: a convex resin portion produced by the curing of a liquid material; and a conductive layer that covers the convex portion. To produce the convex portion, a liquid repellent portion and a lyophilic portion having a high liquid absorbability are formed on the top face of an insulating layer, and the lyophilic portion is cured by the extraction of liquid (see the abstract of patent document 1). This bump structure is formed on the wiring board to electrically connect the wiring board to an IC chip (see paragraphs [0084] to [0086] in patent document 1).

The bump structure is a bump terminal for connecting a printed wiring board and an IC chip, and is not used to connect a multilayer printed wiring board used for semiconductor package and a motherboard (printed wiring board). Theoretically, it is impossible for this bump structure manufacturing method to form a wiring pattern between a convex portion and an insulating layer, and as a result, the wiring pattern area is limited. Furthermore, no printed wiring board structure is disclosed in patent document 1.

[Patent Document 1]

Japanese Unexamined Patent Publication (Kokai) No. 2005-5568

SUMMARY OF THE INVENTION

One objective of the present invention is the provision of a semiconductor package having a superior high frequency characteristics, and a manufacturing method therefor.

Another objective of the present invention is the provision of a semiconductor package in which a large area is available for an internal wiring pattern, and a manufacturing method therefor.

[Means for Solving the Problems and Advantages of the Invention]

A semiconductor package according to the present invention comprises a printed wiring board, an integrated circuit chip and a plurality of bump terminals. The integrated circuit chip is mounted on the obverse face of the printed wiring board and the bump terminals are mounted on the reverse face. Each bump terminal has an insulating core and is coated with a conductor. The insulating core has a flat face directed toward the reverse face of the printed wiring board. The conductive coating is formed on the outer surface of the bump terminal, except for the flat face of the insulating core, and is bonded to the reverse face of the printed wiring board.

According to this semiconductor package, since only an edge of the conductive coating is exposed around the flat face of the insulating core, the parasitic capacitance is reduced and the high frequency characteristics is improved.

It is preferable that the printed wiring board includes an insulating board, an obverse face wiring pattern, an internal wiring pattern, a reverse face wiring pattern and vias. The obverse face wiring pattern is formed on the obverse face of the insulating board and is electrically connected to the integrated circuit chip. The internal wiring pattern is fabricated with clearance holes, and is embedded in the insulating board, and the reverse face wiring pattern is formed on the reverse face of the insulating board and is electrically connected to the bump terminals, while the vias are fitted into the clearance holes and electrically connected to the reverse face wiring pattern. It is further preferable that the reverse face wiring pattern include via lands, which are provided at predetermined locations, opposite the flat faces of the insulating cores, and are electrically connected to the reverse face wiring pattern. The vias and the clearance holes are arranged on the via lands, and, preferably, the clearance holes are smaller than the flat faces of the insulating cores. With this arrangement, deterioration of the high frequency characteristics is suppressed, and a larger area is available for the internal wiring pattern.

A semiconductor package manufacturing method according to the present invention comprises the steps of:

preparing a printed wiring board;

preparing a plurality of bump terminals; and mounting the bump terminals on the reverse face of the printed wiring board.

According to this manufacturing method, since the bump terminal size is such that only the edges of the conductive coatings are exposed around the flat faces of insulating cores mounted on the reverse face of the printed wiring board, reverse face wiring patterns can also be formed in the contact areas for the flat faces of the insulating cores.

Preferably, the step of preparing the bump terminals includes the steps of:
preparing a die having a plurality of recessed portions formed in a main face;
depositing a conductive coating on the internal surfaces of the recessed portions; and
thereafter, filling the recessed portions with an insulating material. This method is used to efficiently manufacture a plurality of bump terminals.

It is preferable that the step of preparing the bump terminals include the steps of:
preparing an insulating rod;
depositing a conductive coating on the side face of the insulating rod; and, thereafter,
cutting the insulating rod. In this manner, a plurality of bump terminals can be efficiently manufactured.

BRIEF DESCRIPTION OF THE DRAWINGS

FIG. 34 is a cross-sectional view of the structure for a multilayer printed wiring board and a bump terminal for a conventional semiconductor package.

DETAILED DESCRIPTION OF THE INVENTION

Figure 1:
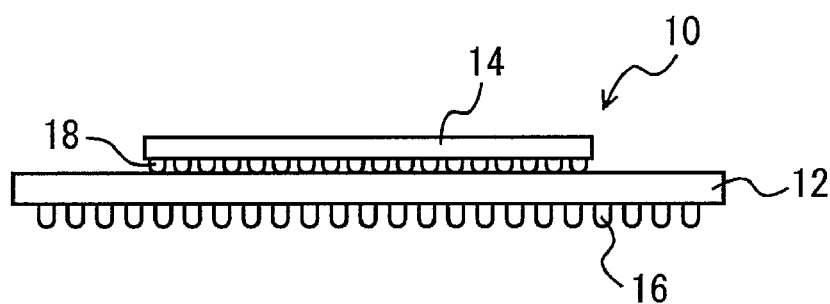
FIG. 1 is a side view of the entire structure of a semiconductor package according to one embodiment of the present invention.

The preferred embodiments of the present invention will now be described in detail while referring to drawings. The same reference numerals are provided to denote corresponding or identical sections, and an explanation for them will not be repeated.

Referring to FIG. 1, a semiconductor package 10 according to one embodiment includes a multilayer printed wiring board 12 on which, on the obverse face, an IC chip 14 is mounted. The semiconductor package 10 has a BGA structure, and includes a grid shaped array of bump terminals 16 arranged on the reverse face of the multilayer printed wiring board 12. The IC chip 14 has a flip-chip connection structure and a grid shaped array of ball electrodes 18 whereat the IC chip 14 is soldered to the obverse face wiring pattern of the multilayer printed wiring board 12.

Figure 2:
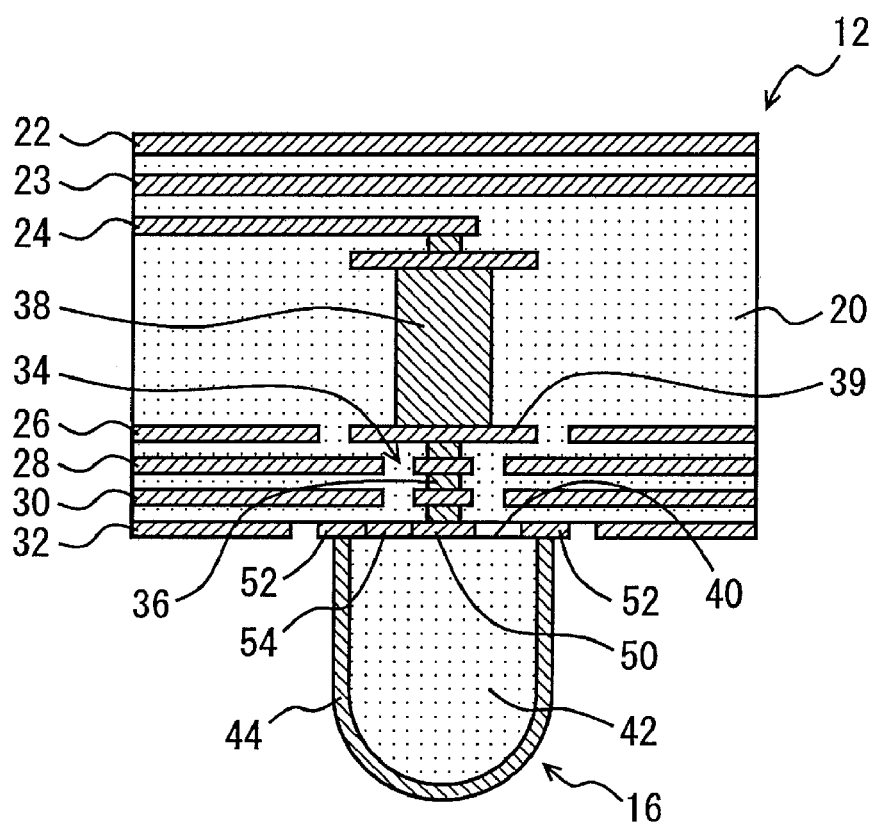
FIG. 2 is an enlarged cross-sectional view of a multilayer printed wiring board and a bump terminal in FIG. 1.

Referring now to FIG. 2, the multilayer printed wiring board 12 includes an insulating board 20, an obverse face wiring pattern 22 formed on the obverse face of the insulating board 20, internal wiring patterns 23, 24, 26, 28 and 30 embedded in the insulating board 20, and a reverse face wiring pattern 32 formed on the reverse face of the insulating board 20. The obverse face wiring pattern 22 is electrically connected to the IC chip 14, and the reverse face wiring pattern 32 is electrically connected to the bump terminals 16. Clearance holes 34 are formed in the internal wiring patterns 28 and 30.

The multilayer printed wiring board 12 also includes small-diameter vias 36 and large-diameter vias 38 embedded in the insulating board 20. The small-diameter vias 36, which are accommodated in the clearance holes 34, contact lands 39, of the large-diameter vias 38, and via lands 50 and connect them electrically.

Figure 3:
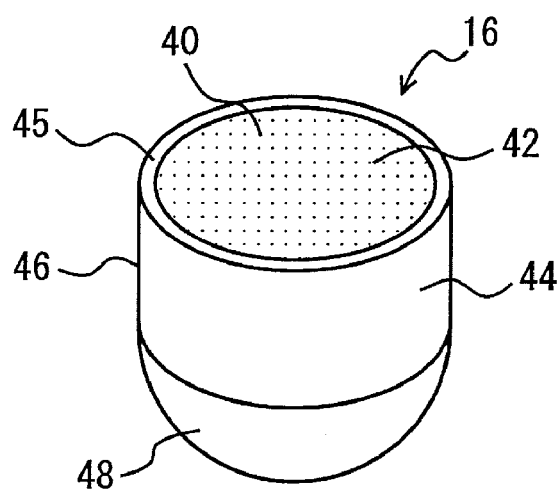
FIG. 3 is a perspective view of the bump terminal in FIGS. 1 and 2.

Referring to FIG. 3, each of the bump terminals 16 includes an insulating core 42 and a conductive coating 44. The insulating core 42 is formed of an insulating material such as a resin, and has a flat face 40 that is bonded to the reverse face of the multilayer printed wiring board 12. The conductive coating 44 is a conductive material such as copper that is deposited on all the outer surfaces of the bump terminal 16, except the flat face 40 of the insulating core 42. The bump terminal 16 has a cylindrical body 46 and a semispherical head 48, and an end face 45 of the conductive coating 44 appears as a ring on the same plane as the flat face 40 of the insulating core 42.

Figure 4:
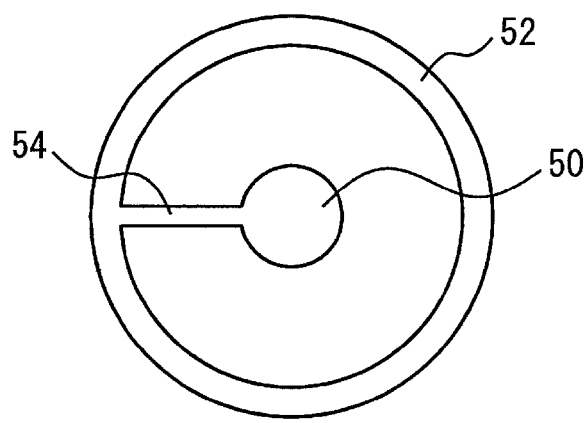
FIG. 4 is a plan view of a reverse face wiring pattern to be bonded to the bump terminal in FIG. 3.

As shown in FIG. 4, the reverse face wiring pattern 32 includes a via land 50, an annular connection pad 52 and a lead line 54, which connects the via land 50 and the connection pad 52. The via land 50 is formed in the center, opposite the flat face 40 of the insulating core 42, while the annular connection pad 52 is formed around the outer edge, opposite the ring shaped end face 45 of the conductive coating 44, and has a slightly greater width than has the end face 45. Then, since a small-diameter via 36 and a large-diameter via 38 are located immediately above the via land 50, a clearance hole 34, which has a smaller diameter than has the flat plane 40, is also located immediately above the via land 50.

According to the semiconductor package 10 of this embodiment, the individual bump terminals 16 are formed with the insulating cores 42 and the conductive coatings 44, and since the end faces 45 of the conductive coatings 44 appear as rings around the flat faces 40 of the insulating cores 42, which are bonded to the reverse face of the multilayer printed wiring board, accordingly, the connection pads 52 can also be ring shaped. Furthermore, since the via lands 50 can be located inside the annular connection pad 52, the vias 36 and 38 can be positioned immediately above the bump terminals 16, as in the conventional case. Furthermore, even when the diameter of the clearance holes 34 is slightly greater than the diameter of the vias 36, i.e., much smaller than the diameter of the connection pads 52, the parasitic capacitance between the connection pads 52 and the internal wiring patterns 28 and 30 does not become as great as in the conventional case, where BGA pads are circular. Thus, deterioration of the high frequency characteristics can be prevented, and a large area can be obtained for the internal wiring patterns 28 and 30.

Figure 5:
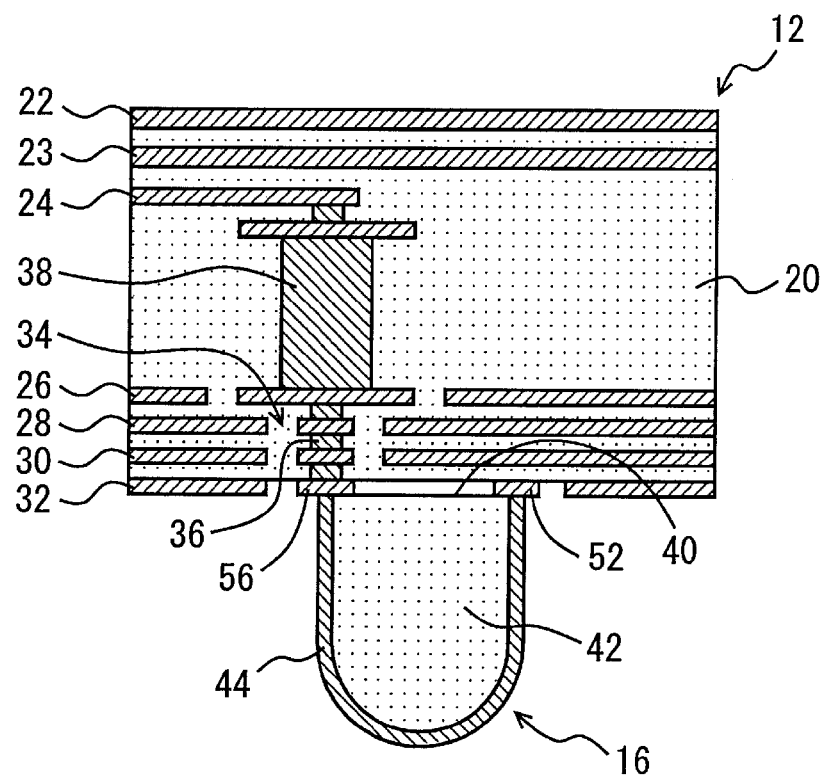
FIG. 5 is a diagram showing a modification of the multilayer printed wiring board according to the embodiment.
Figure 6:
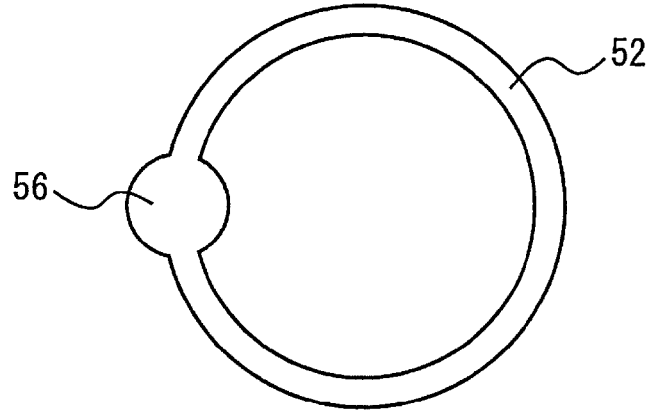
FIG. 6 is a plan view of a reverse face wiring pattern to be bonded to a bump terminal in FIG. 5.
Figure 7A:
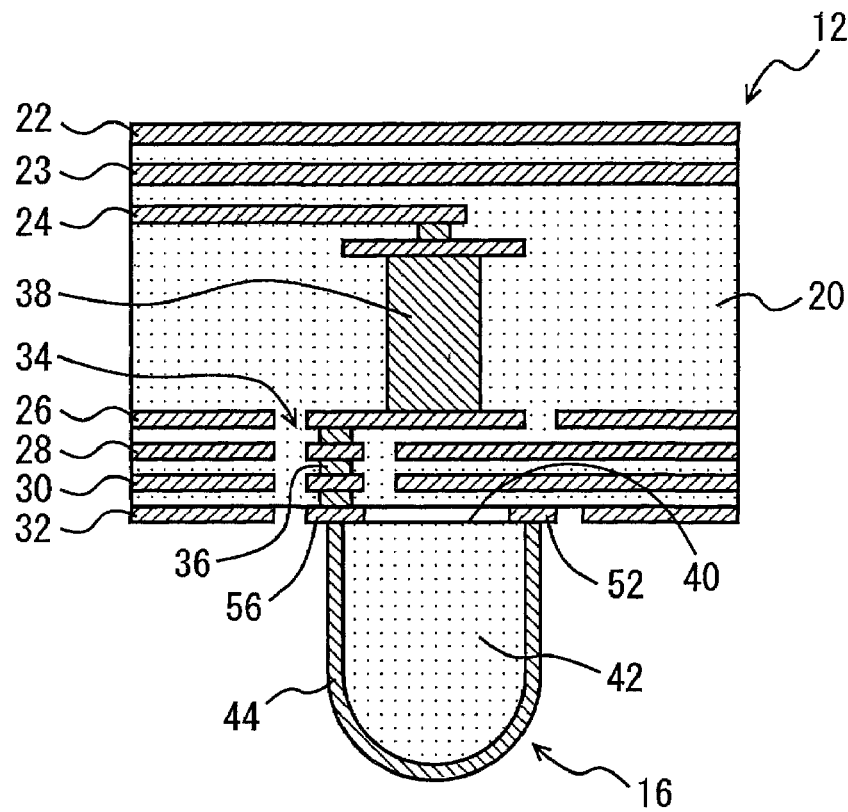
FIG. 7A is a diagram showing another modification of the multilayer printed wiring board according to the embodiment.
Figure 7B:
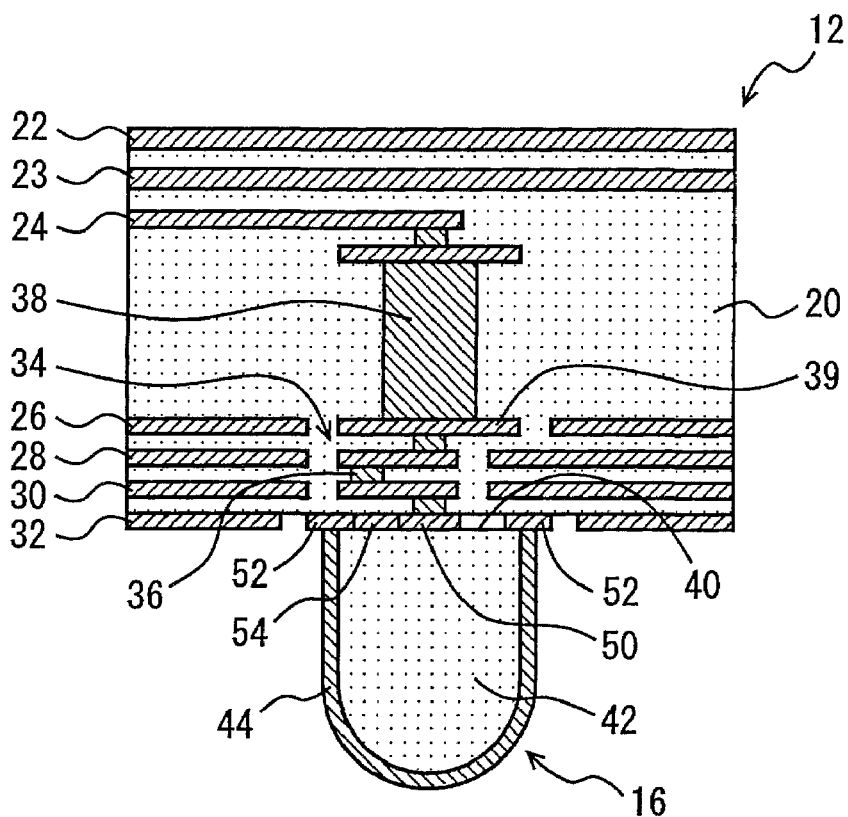
FIG. 7B is a diagram showing an additional modification of the multilayer printed wiring board according to the embodiment.

In the above embodiment, the small-diameter vias 36 and the large-diameter vias 38 are located immediately above the bump terminals 16. However, as in an example shown in FIG. 5, these vias may be located at the edges of the bump terminals 16. In this case, the clearance holes 34 are also aligned relative to the edges of the bump terminals 16. Furthermore, as shown in FIG. 6, via lands 56 for small-diameter vias 36 can be arranged on the annular connection pads 52. Or as shown in FIG. 7A, only the small-diameter vias 36 may be located at the edges of the bump terminals 16. As further shown in FIG. 7B, the small-diameter vias 36 may be shifted for individual layers. In these cases, the internal wiring patterns 28 and 30 cover the bump terminals 16, from above, and there is little increase in the parasitic capacitance between the connection pads 52 and the internal wiring patterns 28 and 30.

Figure 8:
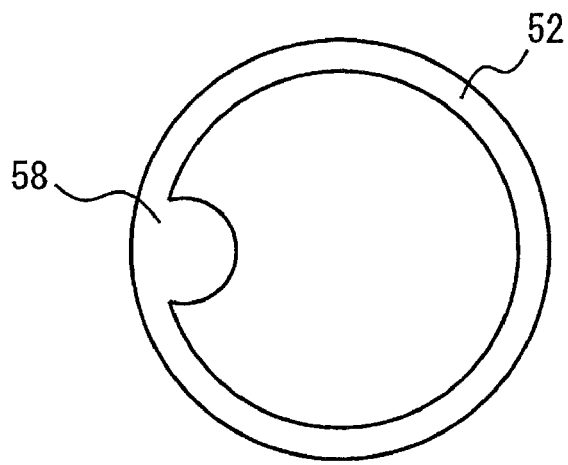
FIG. 8 is a diagram showing a modification of the reverse face wiring pattern to be bonded to the bump terminals according to the embodiment.

Additionally, as shown in FIG. 8, via lands 58 for the small-diameter vias 36 may be arranged so they contact the inside the annular connection pads 52.

Figure 9:
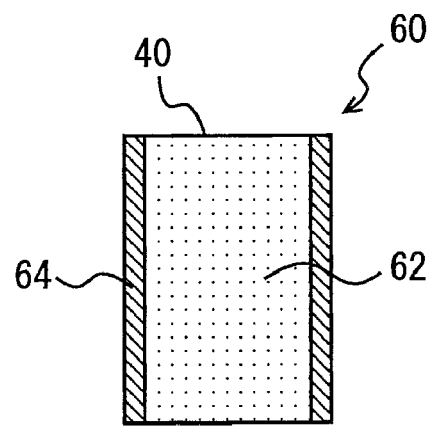
FIG. 9 is a diagram showing a modification of the bump terminal according to the embodiment.
Figure 10:
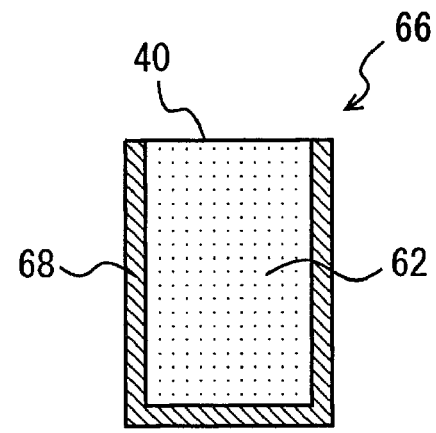
FIG. 10 is a diagram showing another modification of the bump terminal according to the embodiment.

As shown in FIG. 9 or 10, cylindrical bump terminals 60 or 66 may be employed. The bump terminal 60 in FIG. 9 includes a cylindrical insulating core 62 and a conductive coating 64 deposited on the cylindrical side face. A conductive coating 68 for the bump terminal 66 in FIG. 10 is also deposited across the bottom of the insulating core 62.

A method for manufacturing the semiconductor package 10 will now be explained.

Figure 11:
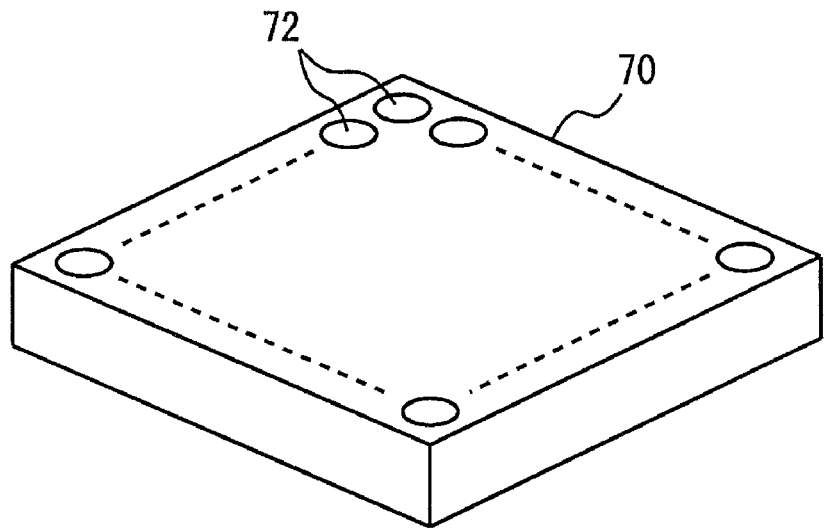
FIG. 11 is a perspective view of a bump terminal molding die used for a method for manufacturing a semiconductor package shown in FIG. 1.
Figure 12:
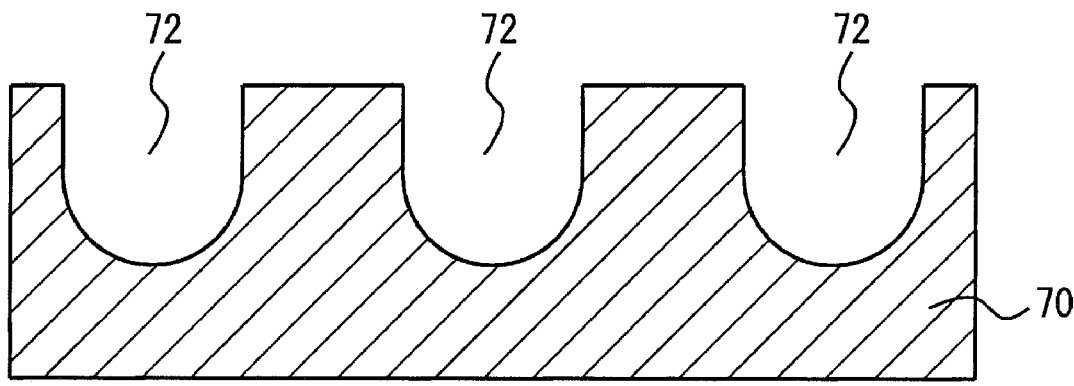
FIG. 12 is a cross-sectional view of the bump terminal molding die shown in FIG. 11.

First, as shown in FIGS. 11 and 12, a resin, bump terminal molding die 70 is prepared. The bump terminal molding die 70 has a plurality of recessed portions 72 arranged as a grid on the main face. The positions of the recessed portions 72 are consonant with the positions of the bump terminals 16 of the semiconductor package 10 to be fabricated. Each recessed portion 72 includes a cylindrical side wall and a semispherical bottom.

Figure 13:
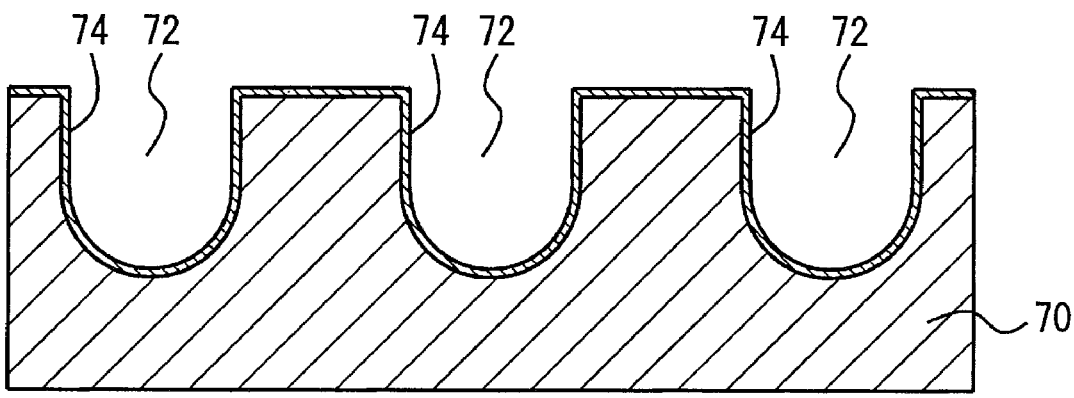
FIG. 13 is a cross-sectional view of a process for using electroless plating to deposit a copper coating on the bump terminal molding die in FIGS. 10 and 12.
Figure 14:
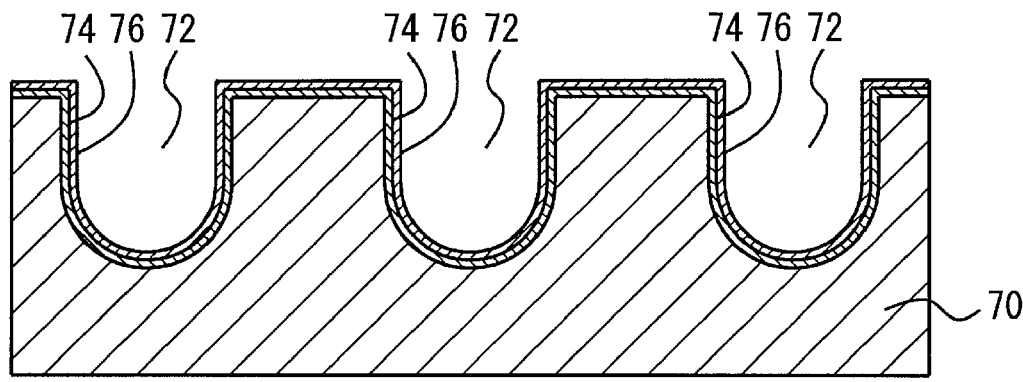
FIG. 14 is a cross-sectional view of a process for using electrolytic plating to form a copper coating following the process in FIG. 13.

As shown in FIG. 13, electroless plating is used to deposit a thin copper coating 74 across the entire face of the bump terminal molding die 70 and on the inner walls of the recessed portions 72. Further, as shown in FIG. 14, electrolysis plating is used to overlay the copper coating 74 with a copper coating 76.

Figure 15:
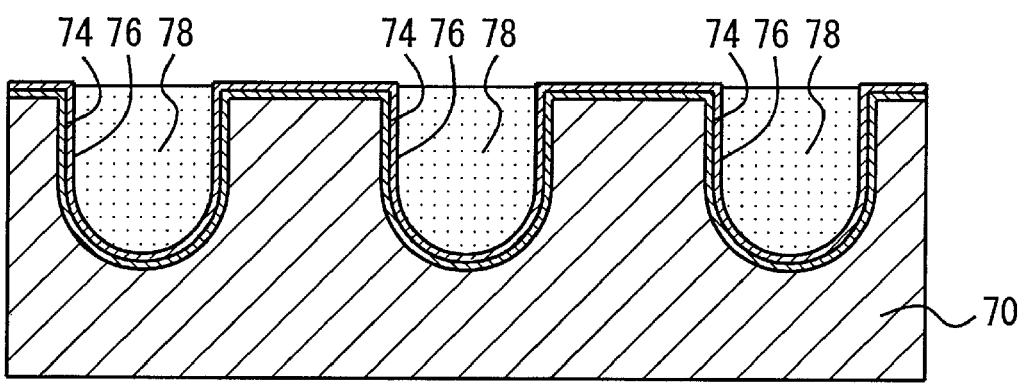
FIG. 15 is a cross-sectional view of a resin filling process performed following the process in FIG. 14.

After the copper coatings 74 and 76 have been deposited, chemicals, such as an alkaline sodium chlorite solution, are used to roughen the surface of the copper coating 76, and then, as shown in FIG. 15, the recessed portions 72 are filled with a liquid resin 78. The liquid resin 78 can be an epoxy or acrylic ultraviolet curing resin, for example, or a polyimide thermosetting resin. Further, a squeegee is used to flatten the upper face of the resin 78 by removing resin that overflows the recessed portions 72. Thereafter, ultraviolet irradiation or heating is used to cure the resin 78.

Figure 16:
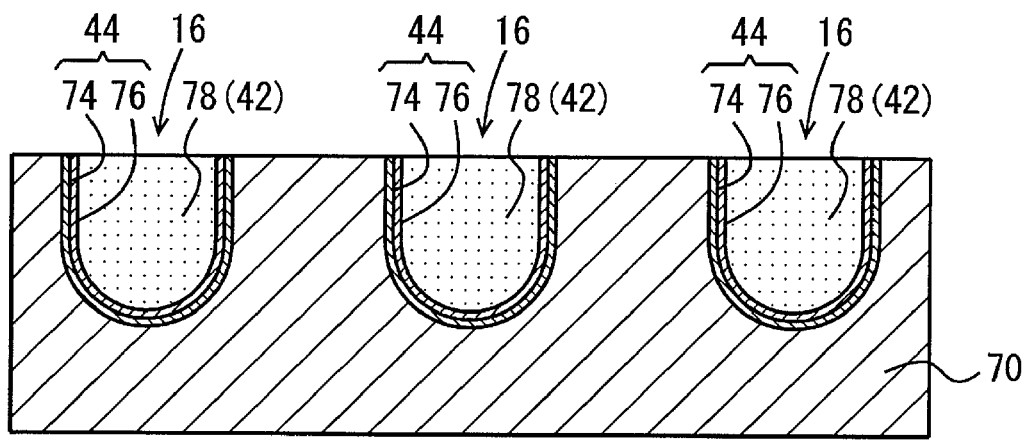
FIG. 16 is a cross-sectional view of a process for removing the copper coating following the process in FIG. 15.

Then, as shown in FIG. 16, chemicals such as a sodium persulfate solution are used to etch extra copper coating 74 and 76 on the main face of the bump terminal molding die 70.

In this fashion, the resin portions 78 are prepared to serve as insulating cores 42 and the copper coating portions 74 and 76 to serve as conductive coatings 44, and bump terminals 16 composed of the insulating core 42 and conductive coating 44 are obtained.

Figure 17A:
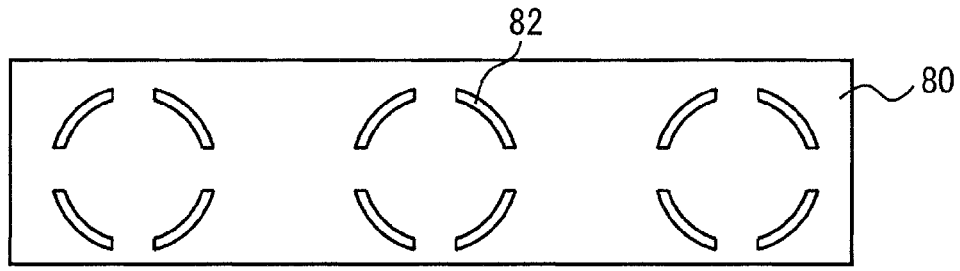
FIG. 17A is a plan view of a mask to be used for the process for applying a solder paste following the process in FIG. 16.
Figure 17B:
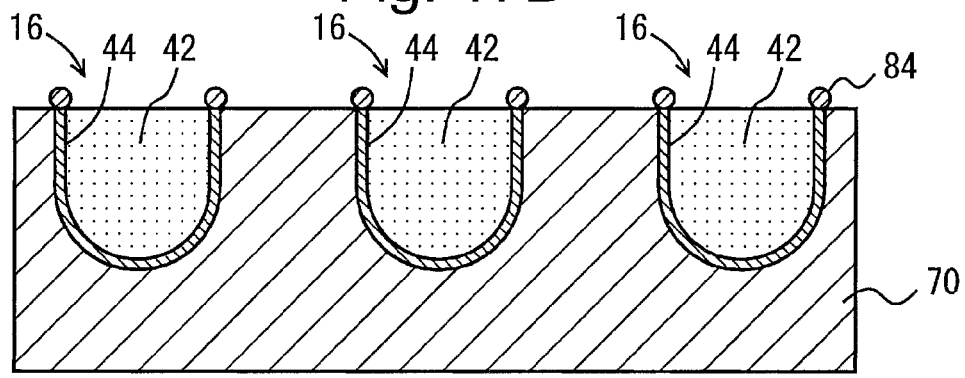
FIG. 17B is a cross-sectional view of the solder applying process.

Following this, as shown in FIG. 17, a mask 80 is used to print solder paste 84 on the end faces of the conductive coatings 44 exposed on the main face of the bump terminal molding die 70. The mask 80 has near annular slits 82 that are formed so they correspond with the annular end faces of the conductive coatings 44. During this specific process, the mask 80 covers the bump terminal molding die 70 and aligns the slits 82 with the end faces 45 of the conductive coating 44, and the solder paste 84 is applied to exposed portions of the end faces 45 of the conductive coatings 44. Then, when the resultant structure is heated for reflow soldering, the solder paste 84 spreads out along and covers the end faces 45 of the conductive coatings 44.

Figure 18A:
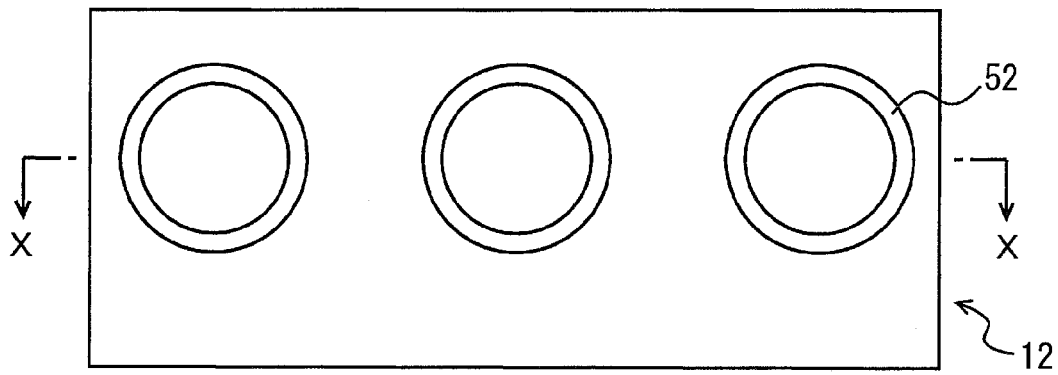
FIG. 18A is a bottom view of a multilayer printed wiring board used for the method for manufacturing the semiconductor package shown in FIG. 1.
Figure 18B:
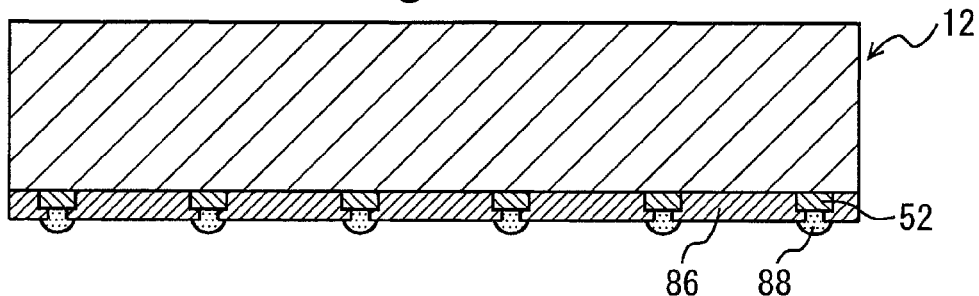
FIG. 18B is a cross-sectional view taken along line X-X.

Also, as shown in FIG. 18, a multilayer printed wiring board 12 is prepared wherein annular connection pads 52 are exposed on the reverse face. First, a solder resist 86 is applied to all the reverse face of the multilayer printed wiring board 12 except the connection pads 52, and then, solder paste 88 is applied to the connection pads 52.

Figure 19:
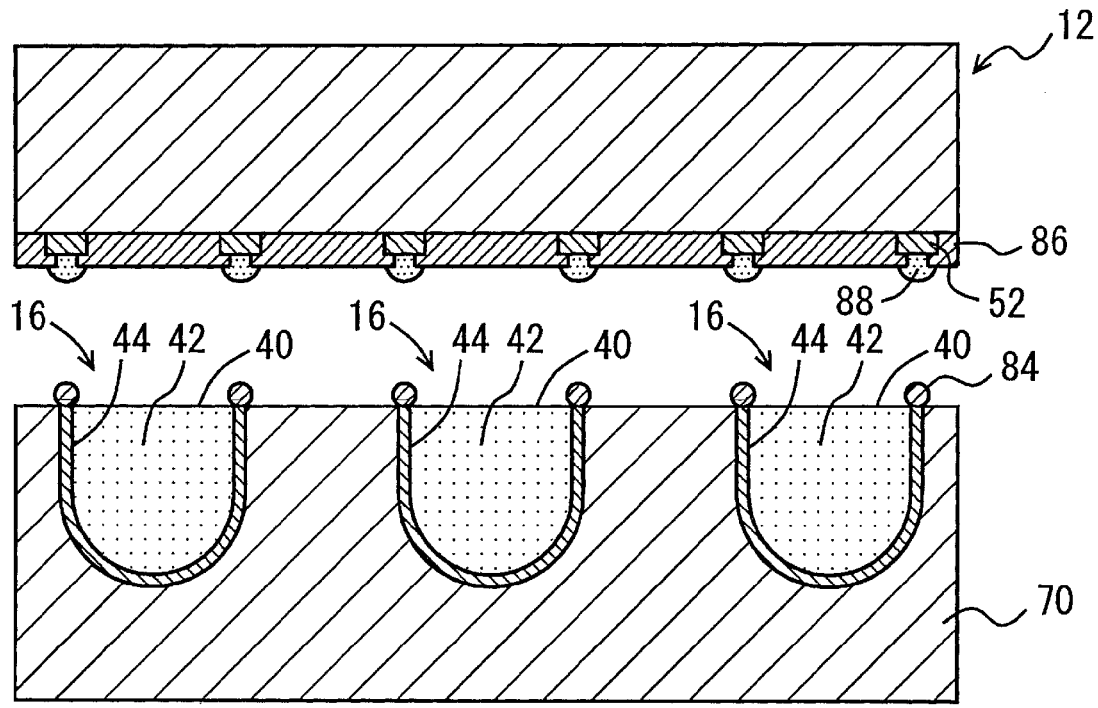
FIG. 19 is a cross-sectional view of a process for bonding bump terminals following the process in FIG. 17B.

Next, as shown in FIG. 19, the main face of the bump terminal molding face 70 (including the bump terminals 16) obtained during the process in FIG. 17 is aligned with the reverse face of the multilayer printed wiring board 12, obtained during the process in FIG. 18, so that the end faces of the annular conductive coatings 44 are aligned with the annular connection pads 52.

While the bump terminal molding die 70 and the multilayer printed wiring board 12 are aligned, the solder pastes 84 and 88 are heated for reflow soldering a predetermined period of time. The solder pastes 84 and 88 are first melted and then solidified, and the bump terminals 16 are securely mounted on the reverse face of the multilayer printed wiring board 12. To increase the bonding strength, an adhesive may be applied to the flat faces 40 of the insulating cores 42, or inside the connection pads 52.

Figure 20:
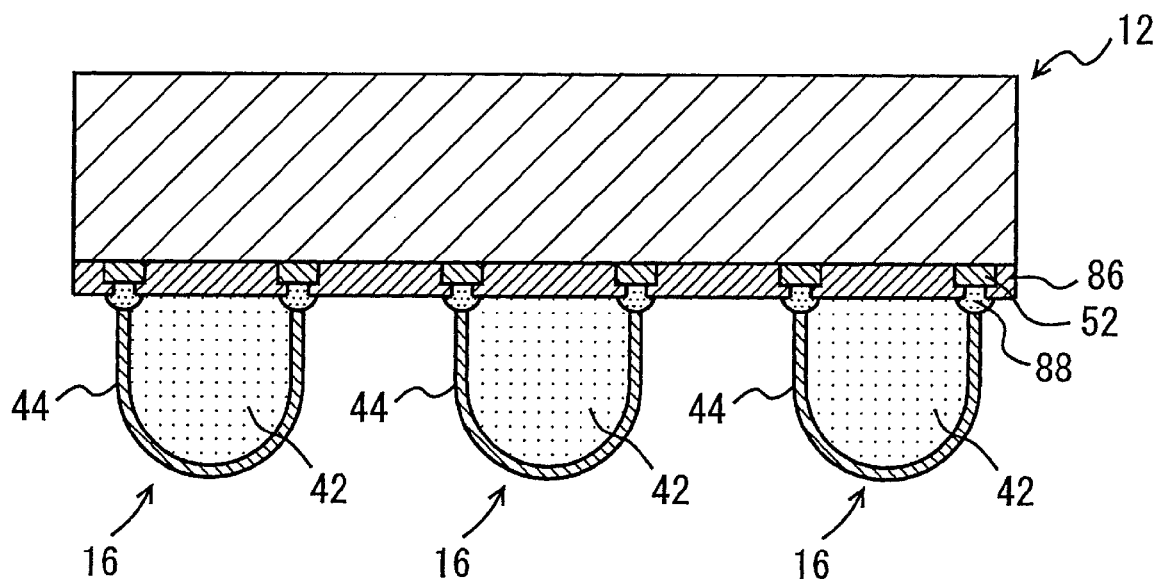
FIG. 20 is a cross-sectional view of a process for removing the bump terminal molding die following the process in FIG. 19.

After the solder pastes 84 and 88 that were melted during the reflow soldering have solidified, as shown in FIG. 20, the bump terminal molding die 70 is removed, completing the process by which multiple bump terminals 16 are simultaneously attached to the reverse face of the multilayer printed wiring board 12.

According to the manufacturing method of this embodiment, the semiconductor package 10, to include the bump terminals 16, can be efficiently fabricated.

Another manufacturing method will now be described.

Figure 21:
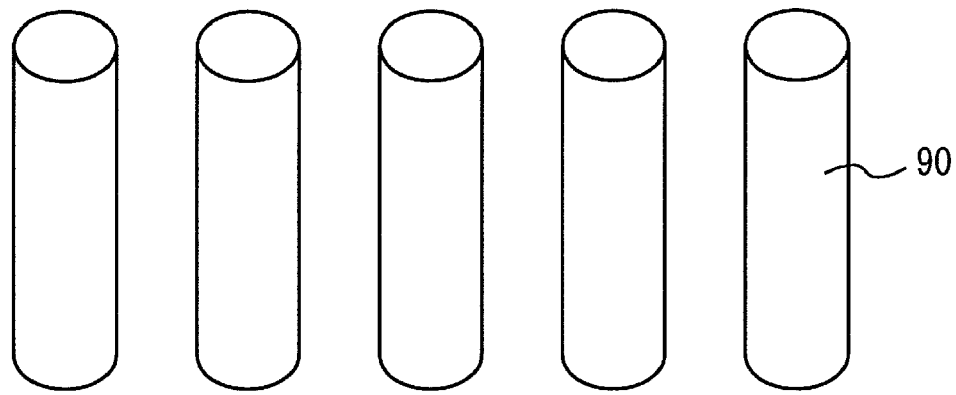
FIG. 21 is a perspective view of insulating rods used for a semiconductor manufacturing method according to another embodiment of the present invention.
Figure 22:
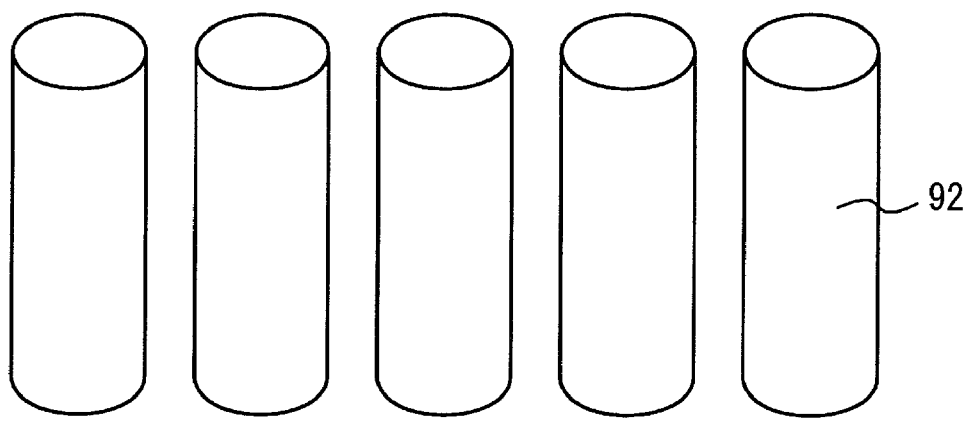
FIG. 22 is a perspective view of a process for forming a copper coating on the insulating rods shown in FIG. 21.
Figure 23:
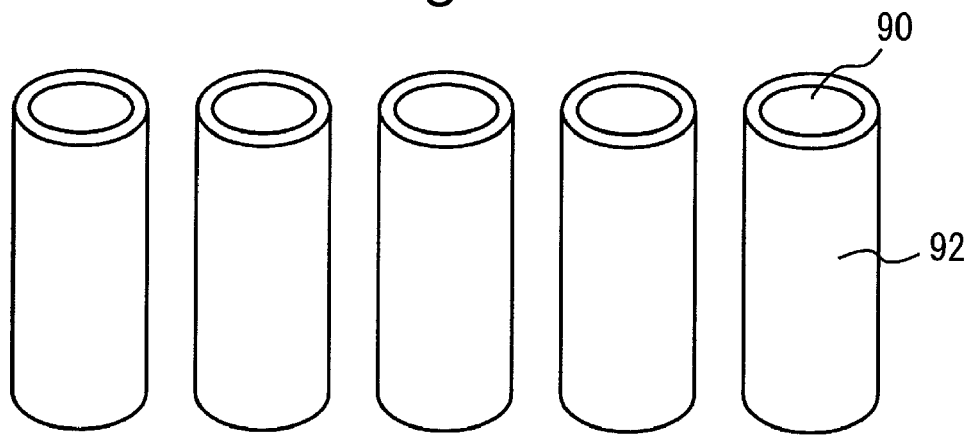
FIG. 23 is a perspective view of a process for cutting off both ends of the insulating rods following the process in FIG. 22.
Figure 24:
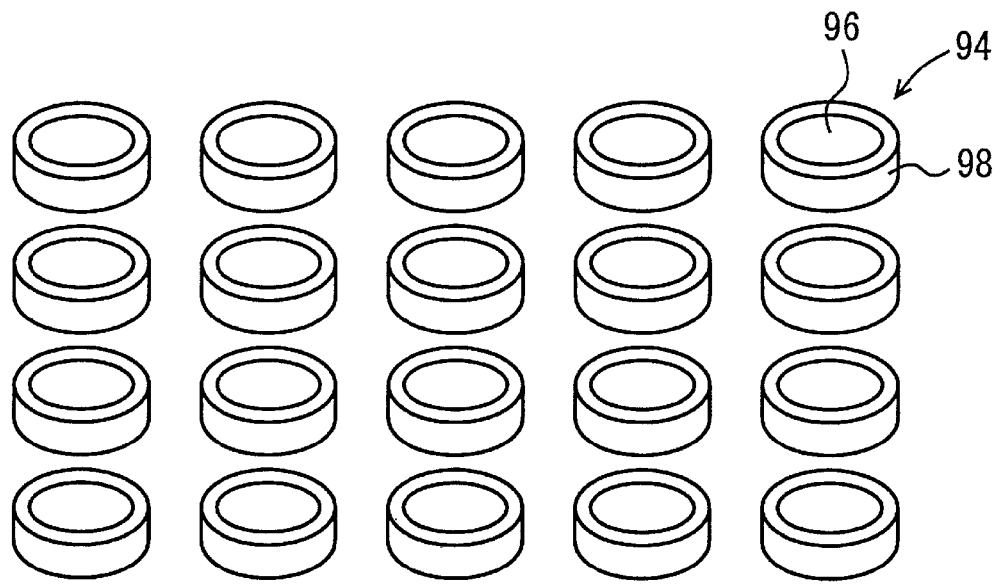
FIG. 24 is a perspective view of cutting the insulating rods into a plurality of segments following the process in FIG. 23.

First, as shown in FIG. 21, cylindrical resin insulating rods 90 are prepared. Then, as shown in FIG. 22, electroless plating and electrolytic plating are used to sequentially deposit a copper coating 92 on and across all the external surfaces (side walls, upper faces and bottom faces) of the insulating rods 90. Following this, as shown in FIG. 23, the copper coating 92 coated ends are cut off, exposing the ends of the insulating rods 90, so that only the side walls are covered with copper coating 92. Next, as shown in FIG. 24, the insulating rods 90, on which the copper coating 92 is deposited, are divided into a plurality of segments. The thus obtained insulating rod 90 segments are used as insulating cores 96, and the copper coatings 92 deposited on the segments are used as conductive coatings 98 to provide bump terminals 94 having a predetermined height.

Figure 25A:
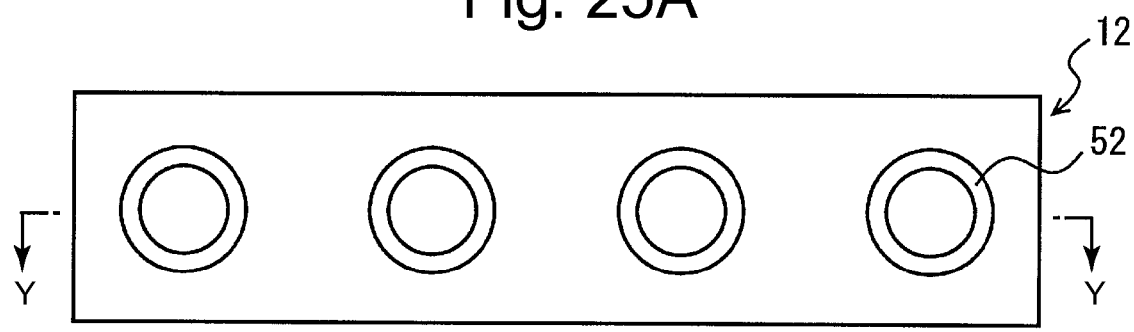
FIG. 25A is a bottom view of the multilayer printed wiring board.
Figure 25B:
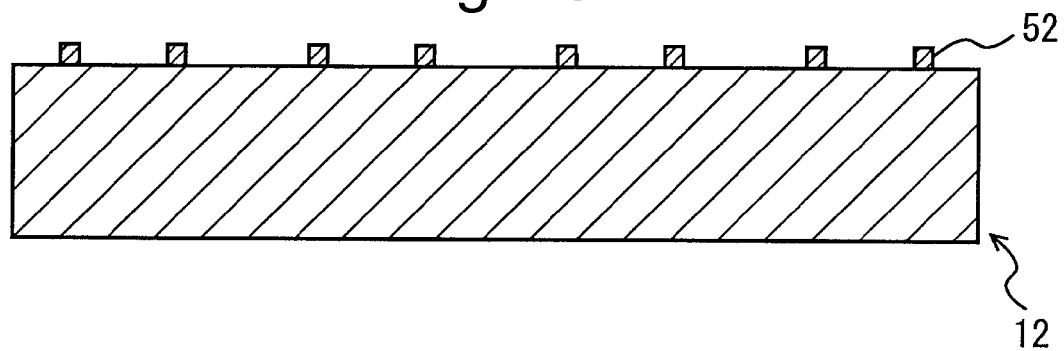
FIG. 25B is a cross-sectional view taken along line Y-Y in FIG. 25A.

Also, as shown in FIGS. 25A and 25B, a multilayer printed circuit board 12 is prepared whereon annular connection pads 52 are exposed on the reverse face (the upper face in FIG. 25B).

Figure 26A:
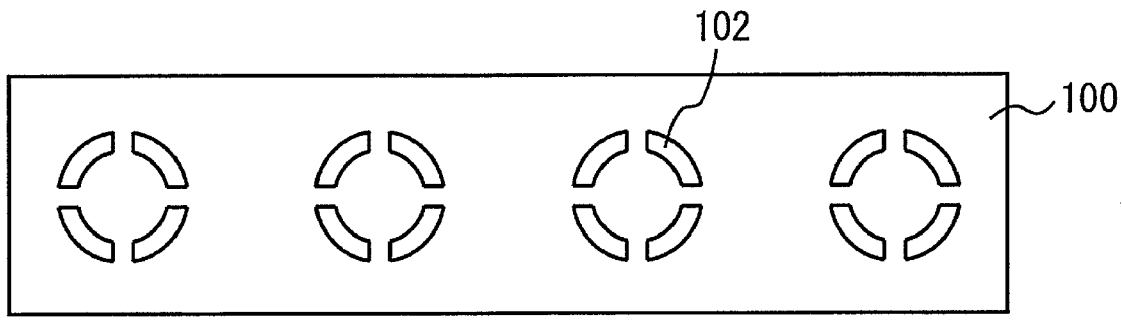
FIG. 26A is a plan view of a mask to be used for a process for applying a solder paste to the multilayer printed circuit board shown in FIG. 25.
Figure 26B:
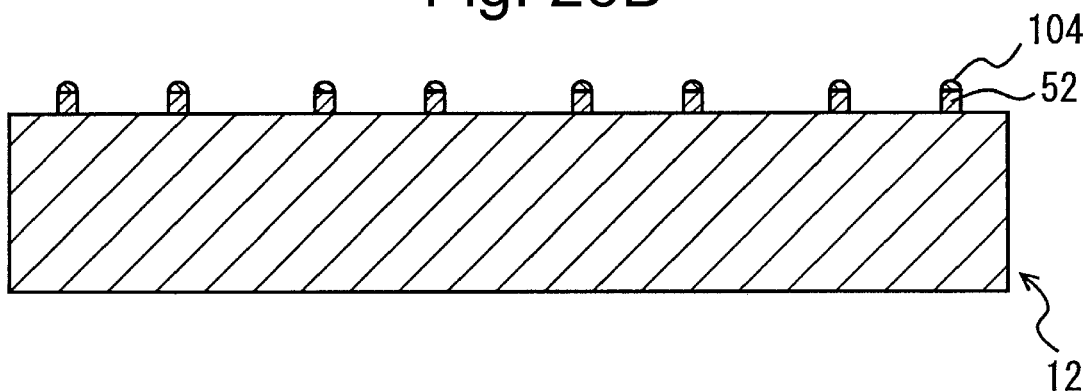
FIG. 26B is a cross-sectional view of the solder applying process in FIG. 26A.

Then, as shown in FIGS. 26A and 26B, a mask 100 is used to print solder paste 104 on exposed portions of the annular connection pads 52 on the reverse face of the multilayer printed wiring board 12. The mask 100 includes near annular slits 102 that are formed so they correspond with the annular connection pads 52. Specifically, at this step, the mask 100 is positioned so it covers the multilayer printed wiring board 12 and aligns the slits 102 and the connection pads 52, so that the solder paste 104 can be applied to exposed portions of the connection pads 52. Later, however, when the resultant structure is heated during reflow soldering, the solder paste 104 spreads out, entirely covering the connection pads 52.

Figure 27:
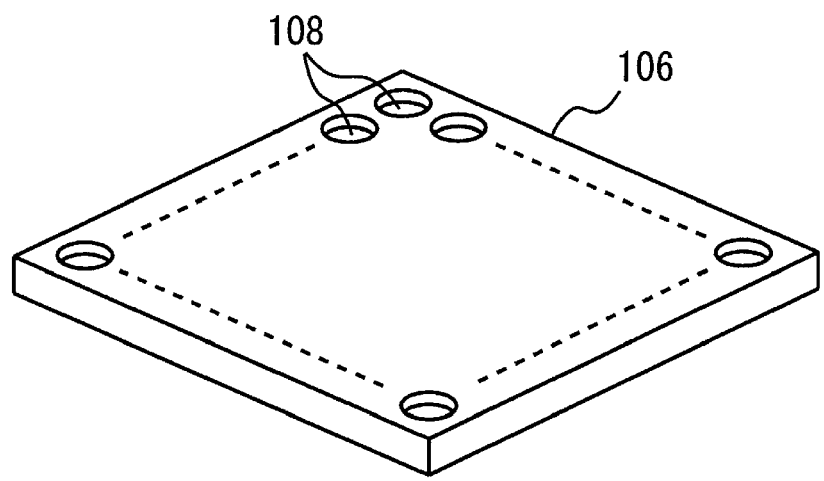
FIG. 27 is a perspective view of a positioning jig used for positioning bump terminals shown in FIG. 24.

Further, as shown in FIG. 27, a jig 106 for positioning the bump terminals 94 is prepared. The positioning jig 106 is a rectangular plate, having a thickness about the same as the height of the bump terminals 94, in which is formed a grid comprising a plurality of circular through holes 108. The through holes are aligned with and have slightly larger diameters than the connection pads 52 of the multilayer printed wiring board 12.

Figure 28:
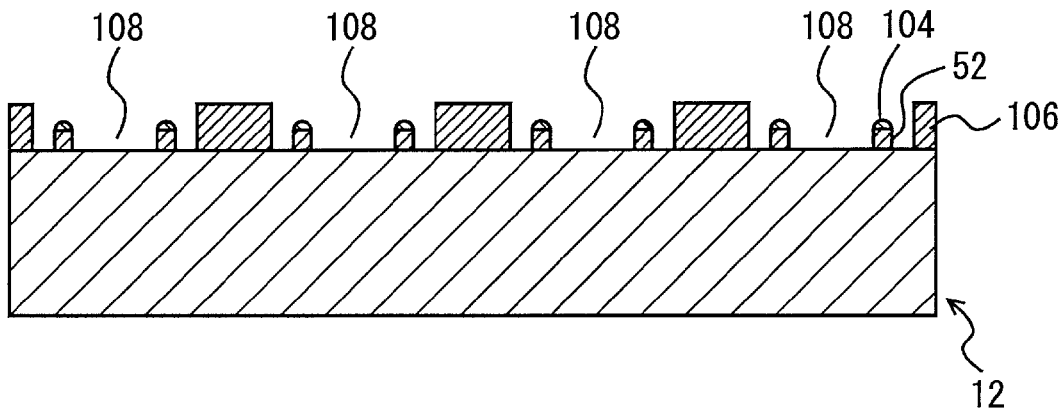
FIG. 28 is a cross-sectional view of a process for mounting the positioning jig on the multilayer printed wiring board following the process shown in FIG. 26B.
Figure 29:
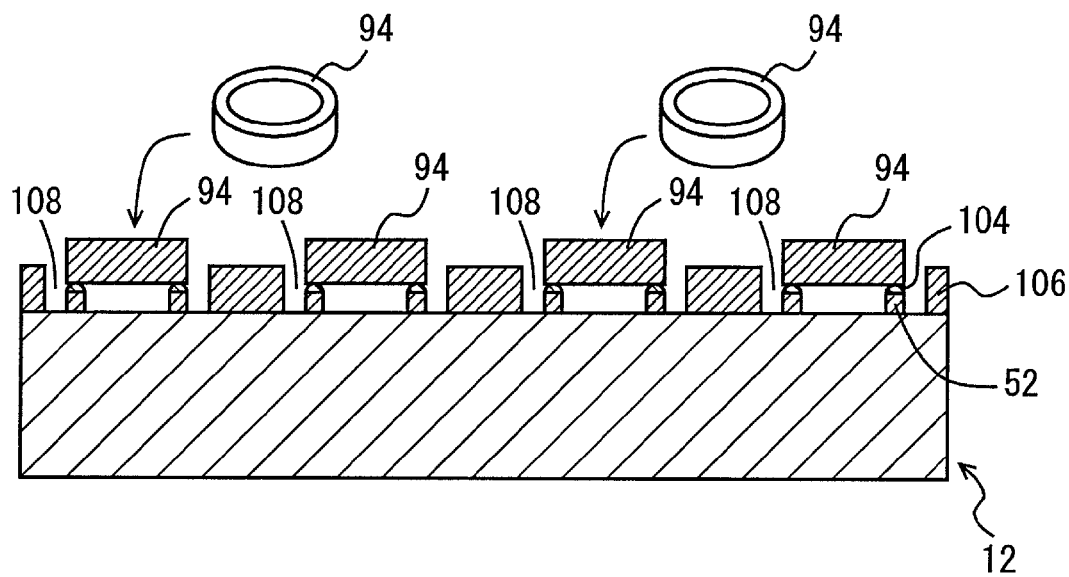
FIG. 29 is a cross-sectional view of a process for fitting the bump terminals in the through holes of the positioning jig following the process in FIG. 28.

After the solder paste 104 has been applied, as shown in FIG. 28, the positioning jig 106 is mounted on the reverse face of the multilayer printed wiring board 12, and the through holes 108 are aligned with the connection pads 52. Thereafter, as shown in FIG. 29, bump terminals 94 are fitted into the through holes 108 of the positioning jig 106. Through this process, the bump terminals 94 can be mounted with the cut faces of the insulating rods 90 directed toward the reverse face of the multilayer printed wiring board 12. Only one bump terminal 94 can be inserted into each through hole 108.

Figure 30:
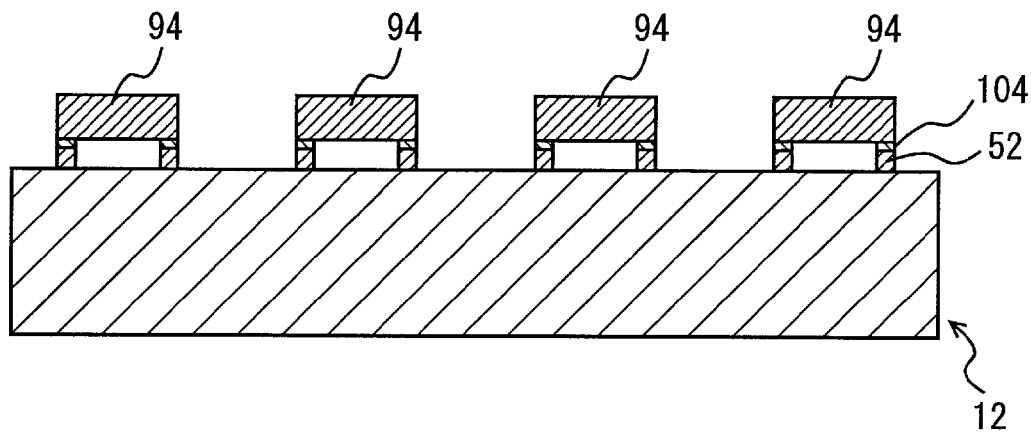
FIG. 30 is a cross-sectional view of a process for removing the positioning jig following the process in FIG. 29.

After the bump terminals 94 have been mounted, as shown in FIG. 30, reflow soldering is used to heat the solder paste 104 for a predetermined period of time. And since the solder paste 104 is first melted and then solidified, the bump terminals 94 are secured to the connection pads 52. After the solder paste 104 has solidified, the positioning jig 106 is removed.

According to the above described manufacturing method, a semiconductor package that includes bump terminals 94 can be efficiently manufactured.

An explanation will now be given for a method used to mount the thus obtained semiconductor package on a motherboard.

Figure 31:
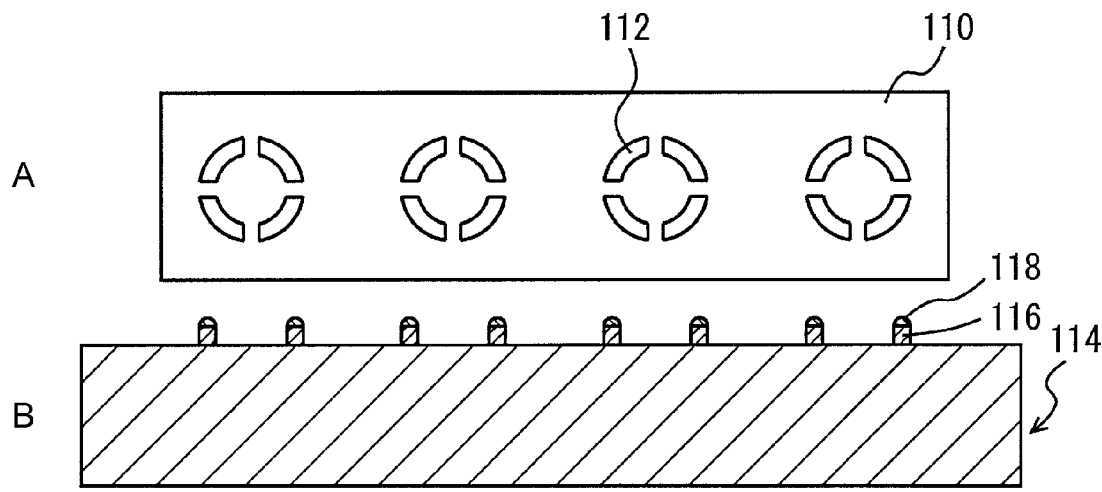
FIG. 31A is a plan view of a mask to be used for a process for applying a solder paste to a motherboard in order to mount, on the motherboard, a semiconductor package manufactured during the process shown in FIGS. 21 to 30.
FIG. 31B is a cross-sectional view of the solder applying process in FIG. 31A.

First, as shown in FIGS. 31A and 31B, a mask 110 is used and solder paste 118 is printed on annular connection pads 116 formed on a motherboard 114. In the mask 110, near annular slits 112 are formed that correspond to the annular connection pads 116. Specifically, at this step, the mask 110 is positioned so it covers the motherboard 114 and aligns the slits 112 and the connection pads 116, and the solder paste 118 is then applied to exposed portions of the connection pads 116. Later, when the resultant structure is heated during reflow soldering, the solder paste 118 spreads out until it covers all the connection pads 116.

Figure 32:
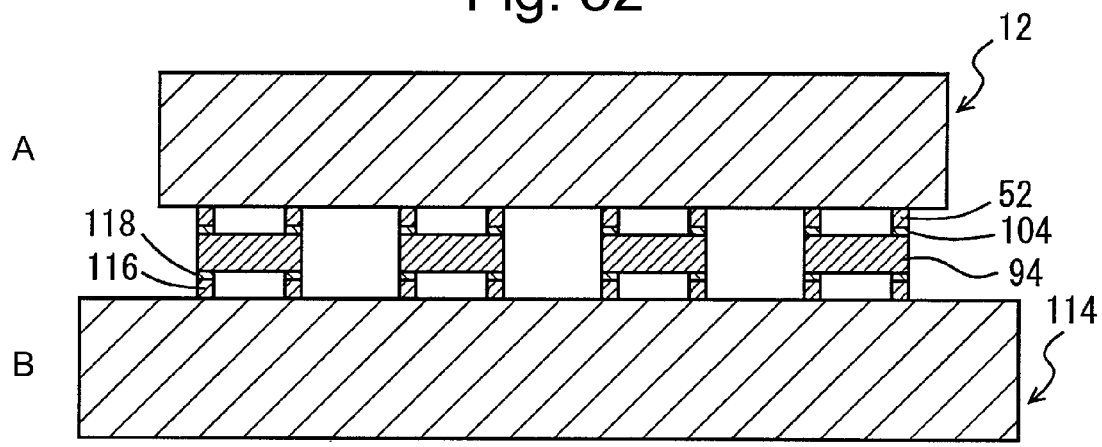
FIG. 32 is a cross-sectional view of a process for bonding the semiconductor package to the motherboard following the process in FIG. 31.

After the solder paste 118 has been applied, as shown in FIG. 32, the semiconductor package obtained through the process in FIG. 30 is aligned with the motherboard 114 obtained through the process in FIGS. 31A and 31B, with the bump terminals 94 facing downward and aligned with the connection pads 116. Thereafter, the bump terminals 94 are bonded to the connection pads 116 using reflow soldering. The gap between the multilayer printed wiring board 12 and the motherboard 114 can be freely adjusted by changing the height of the bump terminals 94.

Figure 33:
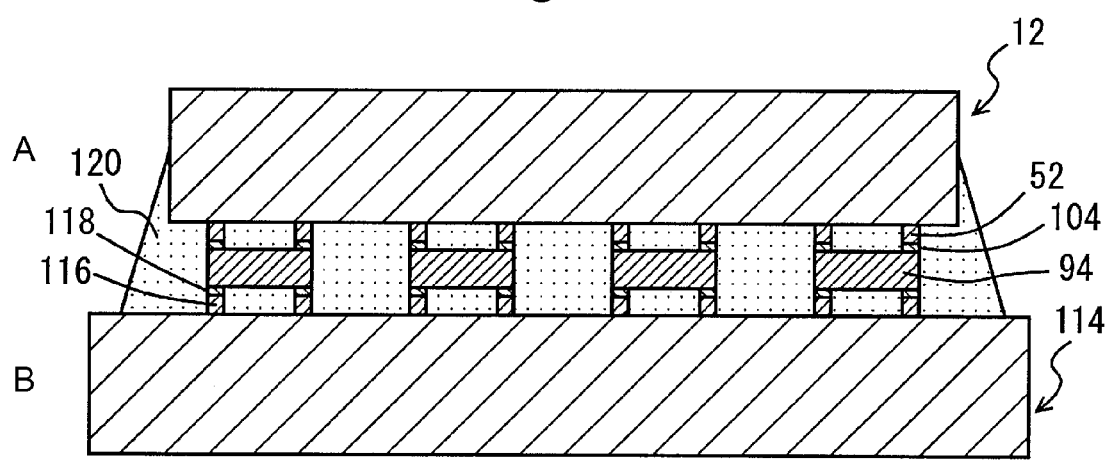
FIG. 33 is a cross-sectional view of an underfill filling process following the process in FIG. 32.

Finally, as shown in FIG. 33, an underfill material 120 is used to fill the gap between the multilayer printed wiring board 12 and the motherboard 114, and is cured to provide a reliable connection.

According to this manufacturing method, a single insulating rod 90, on which copper coating 92 has been deposited, is divided into a plurality of segments to provide multiple bump terminals 94. However, each short insulating rod may again be cut to provide two bump terminals 94. Further, both insulating rod ends need not necessarily be cut off, and in short, cut faces need only be bonded to the connection pads 52.

Furthermore, using either of the manufacturing methods described above, bonding of the bump terminals 16 or 94 may be performed before or after the IC chip 14 is mounted. In addition, instead of producing the above bump terminals, market-available solder balls (e.g., Micropearl SOL (trademark) by Sekisui Chemical Co., Ltd.) that include spherical, solder plated resin cores may be cut in half for use as bump terminals. Also, the bump terminals 16 or 94 may not only have a cylindrical shape, but may instead be prism shaped, and in short, so long as the function is appropriately performed, no special shape limitation is imposed. Finally, the IC chip used is not limited to a flip chip, and an IC chip and a printed wiring board may be connected by wire bonding.

The embodiment of the present invention has been described, however, this embodiment is merely an example for carrying out the present invention. The present invention is not limited to the above embodiment, and the embodiment can be variously modified without departing from the subject of the invention.

What is claimed is:

1. A manufacturing method for a semiconductor package including a printed wiring board and an integrated circuit chip mounted on an obverse face of said printed wiring board, comprising:
    a step of preparing said printed wiring board;
    a step of preparing a plurality of bump terminals, each including an insulating core, having a flat face to be directed towards a reverse side of said printed wiring board, and a conductive film, formed on a surface aside from the flat face of said insulating core; and said step of preparing a plurality of bump terminals further comprising:
        a step of preparing a die having a plurality of recessed portions formed in a main face;
        a step of forming said conductive film on an internal surface of said recessed portions; and
        after forming said conductive film, a step of filling said recessed portions with an insulating material;
    a step of mounting said plurality of bump terminals on the reverse face of said printed wiring board, said step of mounting said plurality of bump terminals further comprising:
        a step of applying solder to the reverse face of said printed wiring board and to an end face of said conductive film that appears on a same plane as said flat face of said insulating core;
        after the soldering, a step of aligning the die and said printed wiring board so that a main face of the die is directed towards the reverse face of said printed wiring board;
        after the aligning of said die and said printed wiring board, a step of sequentially heating a solder for a predetermined period of time;
        after the solder, melted by the heating step, has solidified, a step of removing the die.

2. A semiconductor package manufacturing method according to claim 1, wherein
    said step of preparing said bump terminals includes:
    a step of preparing an insulating rod;
    a step of forming said conductive film on a side face of said insulating rod; and
    after forming said conductive film, a step of cutting said insulating rod.

3. A semiconductor package manufacturing method according to claim 2, wherein
    said step of mounting said bump terminals includes:
    a step of applying solder to the reverse face of said printed wiring board and to an end face of said conductive film that appears on a same plane as a cut face of said insulating rod;
    after the soldering, a step of mounting said bump terminals on said reverse face of said printed wiring board so that a cut face of the insulating rod is directed towards the reverse face of said printed wiring board; and
    after mounting said bump terminals, a step of heating the solder for a predetermined period of time.

4. A semiconductor package manufacturing method according to claim 1, further comprising:
    a step of preparing a jig having wherein a plurality of through holes are formed;
    wherein said step of mounting said bump terminals includes:
    a step of mounting the jig on the reverse face of said printed wiring board; and
    after mounting the jig, a step of fitting said bump materials into the through holes; and
    wherein the manufacturing method also includes:
    step of removing the jig, after the solder melted by the heating step, has solidified.

* * * * *